United States Patent
Li et al.

(10) Patent No.: US 10,403,194 B2
(45) Date of Patent: Sep. 3, 2019

(54) DISPLAY PANEL AND DISPLAY DEVICE

(71) Applicant: Shanghai Tianma AM-OLED Co., Ltd., Shanghai (CN)

(72) Inventors: Chunyang Li, Shanghai (CN); Dongxu Xiang, Shanghai (CN); Yue Li, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/787,379

(22) Filed: Oct. 18, 2017

(65) Prior Publication Data

US 2018/0342194 A1    Nov. 29, 2018

(30) Foreign Application Priority Data

May 27, 2017 (CN) .......................... 2017 1 0395714

(51) Int. Cl.
*G02F 1/1333* (2006.01)
*G02F 1/1343* (2006.01)
(Continued)

(52) U.S. Cl.
CPC ......... *G09G 3/2092* (2013.01); *G09G 3/3266* (2013.01); *G09G 3/3677* (2013.01);
(Continued)

(58) Field of Classification Search
CPC ........... G02F 1/133305; G02F 1/13454; G02F 1/134309; G02F 1/1345; G02F 1/13452;
(Continued)

(56) References Cited

U.S. PATENT DOCUMENTS 6,104,465 A * 8/2000 Na .......................... G02F 1/1345
349/152
6,373,544 B1 * 4/2002 Hirabayashi ...... G02F 1/136277
257/E27.111
(Continued)

FOREIGN PATENT DOCUMENTS

CN   101779227 A   7/2010
CN   104810002 A   7/2015
CN   106711180 A   5/2017

OTHER PUBLICATIONS

Chinese Office Action for corresponding Chinese Application Serial No. 201710395714.0, dated Nov. 19, 2018, pp. 1-8.

*Primary Examiner* — Michael J Eurice
(74) *Attorney, Agent, or Firm* — Tarolli, Sundheim, Covell & Tummino LLP (57) ABSTRACT

A display panel includes a display area, the display area including a plurality of scan lines; and a non-display area, the non-display area including a plurality of gate driving circuits and at least one load compensating unit; wherein at least two of the plurality of scan lines have different lengths; each gate driving circuit is respectively connected with one scan line; each load compensating unit corresponds to one gate driving circuit to compensate a load of one gate driving circuit, and the larger a length of the scan line connected with the gate driving circuit, the smaller a load added by a corresponding load compensating unit. In the display panel provided by the present disclosure, through arranging the load compensating unit, the phenomenon of the non-uniform brightness of the display panel can be improved, and display quality of the display panel can be improved.

15 Claims, 12 Drawing Sheets

(51) Int. Cl.
*G02F 1/1345* (2006.01)
*G09G 3/36* (2006.01)
*H05K 1/00* (2006.01)
*G09G 3/20* (2006.01)
*G09G 3/3266* (2016.01)
*H01L 27/32* (2006.01)
*H01L 27/12* (2006.01)

(52) U.S. Cl.
CPC ...... *G02F 1/13452* (2013.01); *G02F 1/13454* (2013.01); *G02F 1/133305* (2013.01); *G02F 1/134309* (2013.01); *G09G 3/3648* (2013.01); *G09G 3/3674* (2013.01); *G09G 2300/0413* (2013.01); *G09G 2300/0426* (2013.01); *G09G 2300/0876* (2013.01); *G09G 2310/0213* (2013.01); *G09G 2320/0223* (2013.01); *G09G 2320/0233* (2013.01); *H01L 27/1214* (2013.01); *H01L 27/3244* (2013.01); *H01L 27/3276* (2013.01)

(58) Field of Classification Search
CPC ......... G02F 1/136227; G02F 1/136286; G02F 2001/133388; G02F 2201/56; G09G 3/2092; G09G 3/3648; G09G 3/3674; G09G 2300/0413; G09G 2300/0426; G09G 2300/0819; G09G 2300/23; G09G 2300/0876; G09G 2310/0232; G09G 2320/0204; G09G 2320/0233; H01L 27/1214; H01L 27/124; H01L 27/3244; H01L 27/3248; H01L 27/3276; H01L 27/3279
See application file for complete search history.

(56) References Cited

U.S. PATENT DOCUMENTS

| | | | | |
|---|---|---|---|---|
| 6,522,379 B1* | 2/2003 | Ishihara | ............ | G02F 1/133753 349/139 |
| 6,587,174 B1* | 7/2003 | Nakano | ............ | G02F 1/134336 349/139 |
| 10,133,531 B2* | 11/2018 | Yoshitani | ............ | G06F 3/1446 |
| 2003/0042482 A1* | 3/2003 | Jun | ............ | G02F 1/136259 257/40 |
| 2003/0122495 A1* | 7/2003 | Nakanishi | ............ | G02F 1/13454 315/169.3 |
| 2003/0146710 A1* | 8/2003 | Nakanishi | ............ | H01L 27/3223 315/169.3 |
| 2004/0239667 A1* | 12/2004 | Takahashi | ............ | G09G 3/3655 345/212 |
| 2006/0109222 A1* | 5/2006 | Lee | ............ | G02F 1/13338 345/88 |
| 2006/0170854 A1* | 8/2006 | Han | ............ | G02F 1/1339 349/153 |
| 2006/0261331 A1* | 11/2006 | Yukawa | ............ | H01L 27/10 257/40 |
| 2007/0194320 A1* | 8/2007 | Cho | ............ | G02F 1/136227 257/72 |
| 2008/0136756 A1* | 6/2008 | Yeo | ............ | G09G 3/3677 345/87 |
| 2008/0157867 A1* | 7/2008 | Krah | ............ | G06F 3/044 329/304 |
| 2008/0179593 A1* | 7/2008 | Lim | ............ | H01L 27/12 257/59 |
| 2008/0246025 A1* | 10/2008 | Nomura | ............ | H01L 27/1214 257/40 |
| 2008/0278644 A1* | 11/2008 | Fukami | ............ | G02F 1/1395 349/37 |
| 2009/0102824 A1* | 4/2009 | Tanaka | ............ | G02F 1/134309 345/205 |
| 2009/0256817 A1* | 10/2009 | Perlin | ............ | G06F 3/0233 345/174 |
| 2010/0053131 A1* | 3/2010 | Handa | ............ | G09G 3/3233 345/206 |
| 2010/0060608 A1* | 3/2010 | Yousefpor | ............ | G06F 3/0418 345/174 |
| 2010/0110058 A1* | 5/2010 | Moh | ............ | G09G 3/3655 345/211 |
| 2010/0295830 A1* | 11/2010 | Chen | ............ | G09G 3/20 345/206 |
| 2012/0140424 A1* | 6/2012 | Sato | ............ | G02F 1/167 361/749 |
| 2012/0212701 A1* | 8/2012 | Hwang | ............ | G02F 1/13394 349/155 |
| 2012/0262419 A1* | 10/2012 | Hershman | ............ | G06F 3/044 345/174 |
| 2013/0021295 A1* | 1/2013 | Kimura | ............ | G02F 1/13338 345/174 |
| 2013/0135272 A1* | 5/2013 | Park | ............ | G09G 3/3233 345/211 |
| 2013/0258221 A1* | 10/2013 | Fujimoto | ............ | G02F 1/133345 349/33 |
| 2013/0321296 A1* | 12/2013 | Lee | ............ | G06F 3/041 345/173 |
| 2014/0091996 A1* | 4/2014 | Moon | ............ | G09G 3/3685 345/92 |
| 2014/0132526 A1* | 5/2014 | Lee | ............ | G06F 3/0412 345/173 |
| 2014/0240279 A1* | 8/2014 | Hwang | ............ | G06F 3/0412 345/174 |
| 2015/0091858 A1* | 4/2015 | Rosenberg | ............ | G06F 3/0414 345/174 |
| 2015/0219945 A1* | 8/2015 | Kimura | ............ | G09G 3/20 349/152 |
| 2015/0220204 A1* | 8/2015 | Noguchi | ............ | G06F 3/0412 345/174 |
| 2015/0310823 A1* | 10/2015 | Wang | ............ | G09G 5/006 345/212 |
| 2016/0133216 A1* | 5/2016 | Song | ............ | G09G 3/3696 345/205 |
| 2016/0259479 A1* | 9/2016 | Kang | ............ | G06F 11/00 |

* cited by examiner

DISPLAY PANEL AND DISPLAY DEVICE

CROSS-REFERENCE TO RELATED APPLICATIONS

The present application claims priority to Chinese Patent Application No. 201710395714.0, filed on May 27, 2017, the content of which is incorporated herein by reference in its entirety.

TECHNICAL FIELD

The present disclosure relates to the field of display technologies and, particularly, relates to a display panel and a display device.

BACKGROUND

A display panel includes a plurality of scan lines and a plurality of data lines, the scan lines and the data lines are intersected with each other to define a plurality of pixel areas, and the plurality of pixel areas are arranged in an array. With the update of display products, the display panel is becoming more and more popular, the manufactures of the display panel begin to design and produce irregular display panels, the profile of the display panel and display area presents circular shape, oval shape and irregular polygon such as non-rectangular shape.

In an irregular display panel, since the number of pixel in at least two rows are different, therefore, the length of the scan lines in the two rows are different, so that the loads of the gate driving circuit for driving the scan lines are different. The load of the gate driving circuit for driving the scan line with a relative large length is larger than the load of the gate driving circuit for driving the scan line with a relative small length.

In view of this, when the gate driving circuit drives the scan line, the drive signals output by the gate driving circuits for scan lines corresponding to different lengths are different, which cause non-uniform brightness of the display panel, thus the display quality is poor.

SUMMARY

The present disclosure provides a display panel and a display device, which can improve the phenomena of non-uniform brightness of the display panel, so as to improve display quality of the display panel.

A first aspect of the present disclosure provides a display panel, including: a display area, the display area including a plurality of scan lines; and a non-display area, the non-display area including a plurality of gate driving circuits and at least one load compensating unit; wherein at least two of the plurality of scan lines have different lengths; each of the plurality of gate driving circuit is respectively connected with one of the plurality of scan lines; each of the at least one load compensating unit corresponds to one of the plurality of gate driving circuits to compensate a load of one of the plurality of gate driving circuits, and the larger a length of the scan line connected with the gate driving circuit, the smaller a load added by a corresponding load compensating unit.

A second aspect of the present disclosure provides a display device, including a display panel, and the display panel includes: a display area, the display area including a plurality of scan lines; and a non-display area, the non-display area including a plurality of gate driving circuits and at least one load compensating unit; wherein at least two of the plurality of scan lines have different lengths; each of the plurality of gate driving circuit is respectively connected with one of the plurality of scan lines; each of the at least one load compensating unit corresponds to one of the plurality of gate driving circuits to compensate a load of one of the plurality of gate driving circuits, and the larger a length of the scan line connected with the gate driving circuit, the smaller a load added by a corresponding load compensating unit.

The technical solution provided by the present disclosure can reach the following beneficial effects:

The present disclosure provides a display panel, the display panel includes a load compensating unit, the load compensating unit is arranged in the non-display area of the display panel, and the longer the length of the scan line connecting with the gate driving circuit, the smaller the load added on the gate driving circuit by the load compensating unit. After such an arrangement, the load compensating unit can adjust the load of the gate driving circuit corresponding to the load compensating unit, so that the loads of the gate driving circuits connected to the scan lines of different length tend to be identical, so as to improve the phenomenon of the non-uniform brightness of the display panel, and improve display quality of the display panel.

It should be understood that, the above general description and the following description in detail are merely exemplary, which cannot limit the present disclosure.

REFERENCE SIGNS 1- display panel;
  11- display area;
    111- scan line;
      111a- scan line;
      111b- scan line;
      111'- first scan line;
      111"- second scan line;
    112- data signal line;
  12- non-display area;
    121- drive signal line area;
    122- gate driving circuit area;
    124- zigzag region;
  13- pixel unit;
2- integrated circuit;
3- gate driving circuit;
  31- gate electrode drive unit;
  32- gate electrode;
  33- source electrode/drain electrode;
4- load compensating unit;
  41- capacitor;
    411- first metal coupling layer;
    412- dielectric layer;
    413- second metal coupling layer;
  42 - resistor;
    421- wire;
      4211- bending section;
100- display device.

The drawings herein are incorporated into the present description and form a part thereof, which show embodiments of the present disclosure, and are used to explain the principle of the present disclosure together with the description.

DESCRIPTION OF EMBODIMENTS

The present disclosure will be described in further detail with reference to the following embodiments and the accompany drawings.

It should be noted that, the expressions "up", "down", "left" and "right" described in embodiments of the present disclosure are describing according to the view shown in the drawings, which should not be understood as limitations to the present disclosure. Besides, in the context, it should also be understood that, when mention that an element is formed "above" or "below" another element, it can be formed directly "above" or "below" the other element, and can also be formed indirectly "above" or "below" the other element by a middle element.

Figure 1:
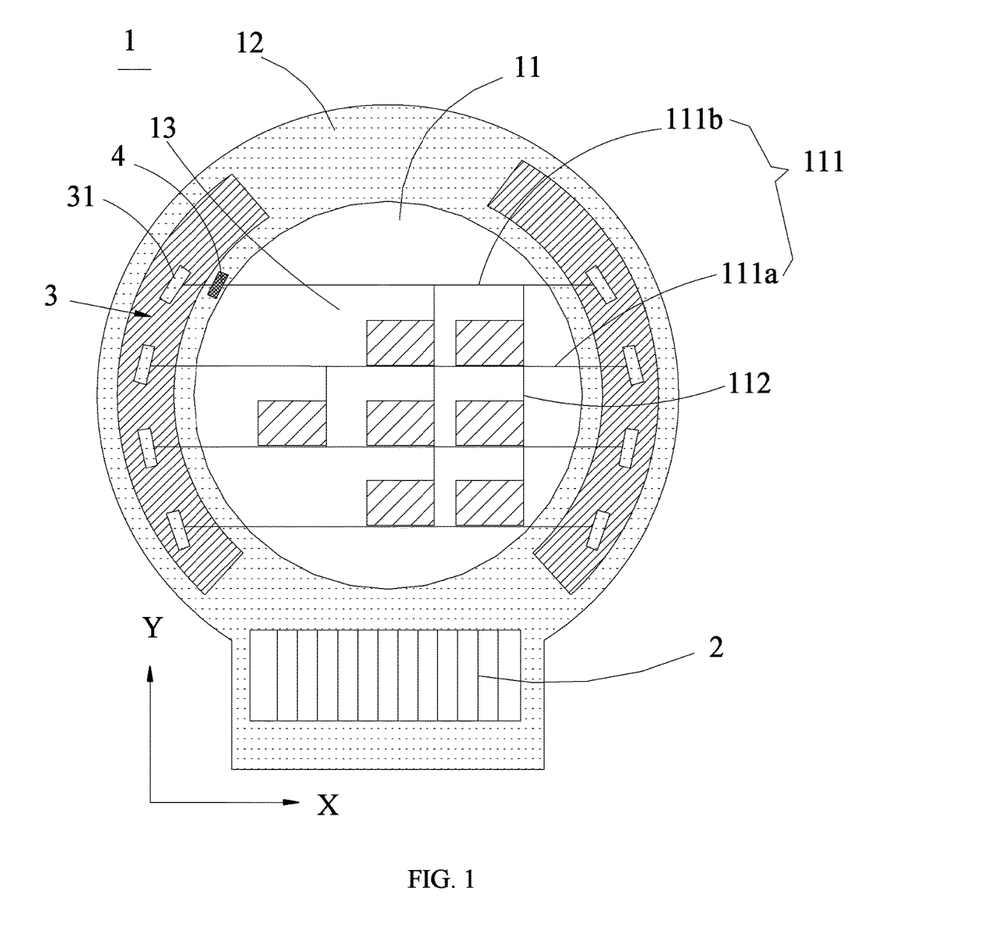
FIG. 1 illustrates a schematic diagram of a display panel according to an embodiment of the present disclosure.

Referring to FIG. 1, which illustrates a structural schematic diagram of a display panel according to an embodiment of the present disclosure. The display panel 1 includes a display area 11 and a non-display area 12. Normally, the display area 11 is located at the central region of the display panel 1, the display area 11 is also called a pixel region, the display area 11 is provided with a plurality of scan lines 111 and a plurality of data signal lines 112. The scan line 111 is configured to provide a scan signal to the pixel unit 13, and extends along the first direction (X direction in FIG. 1) in the display area 11. The data signal line 112 is configured to provide a data signal to the pixel unit 13, and extends along the second direction (Y direction in FIG. 2) in the display area 11. The scan line 111 and the data signal line 112 are intersecting with each other, adjacent two scan lines 111 and adjacent two data signal lines 112 together define a pixel unit 13. The pixel unit 13 is defined by the intersecting portions of the scan lines 111 and the data signal lines 112, and the pixel unit 13 includes a thin film transistor and a pixel electrode.

The non-display area 12 is located at the peripheral region of the display panel 1, and is provided with an integrated circuit 2, a gate driving circuit 3 (normally a shift register) and a wiring group (not shown in figures).

The integrated circuit 2 outputs various signals for driving the scan lines 111 to the gate driving circuit 3 through the wiring group, and outputs data signals of image displayed in the pixel unit 13 to the data signal line 112. The gate driving circuit 3 has a plurality of gate electrode drive units 31 in on-to-one correspondence to the scan lines 111, the gate driving circuit 3 uses timing of the clock signal received through the wiring group to make the gate electrode drive pulse signal output sequential scan signals from the gate driving circuits 3 at both the left and right sides to each scan line 111 at the same time.

Please refer to FIG. 1, the display area 11 is a circular region, from the middle position of the display area 11 along Y direction, the length of the scan line 111 is reduced gradually, the load of the gate driving circuit 3 is reduced correspondingly. Taking the scan line 111a and the scan line 111b in FIG. 1 as an example, since the numbers of the pixel unit 13 on the scan line 111a and the scan line 111b are different, therefore, the loads of the electrode drive circuits 3 respectively driving the scan line 111a and the scan line 111b are different. Moreover, the load of the gate driving circuit 3 corresponding to the scan line 111b is relatively smaller, and the load of the gate driving circuit 3 corresponding to the scan line 111a is relatively larger, so that the drive signals of the scan line 111a and the scan line 111b are different during working, causing non-uniform display.

It should be noted that, each gate driving circuit 3 driving each scan line 111 actually refers to each gate electrode drive unit 31 in the gate driving circuit 3, the gate driving circuit 3 is of a cascade structure.

Referring to FIG. 1, the non-display area 12 also includes at least one load compensating unit 4, the load compensating unit 4 is arranged corresponding to the gate driving circuit 3 to which it compensates, more precisely, each load compensating unit 4 corresponds to a gate electrode drive unit 31 of the gate driving circuit 3, so as to compensate the load in the gate driving circuit 3. In addition, when arranging the load compensating unit 4, the magnitude of load added in the gate driving circuit 3 is proportional to the length of the scan line 111, that is, if the length of the scan line connected to the gate driving circuit 3 is larger, then the load added by the load compensating unit 4 on the gate driving circuit 3 is smaller, and vice versa.

According to the above description, the load compensating unit 4 can adjust the magnitude of load of the corresponding gate driving circuit 3, so that the loads of the gate electrode drive units 31 of each the gate driving circuit 3 connected to the scan lines 111 of different length is tend to be identical, so as to improve the phenomenon of the non-uniform brightness of the display panel 1, and improve display quality of the display panel 1.

Figure 2:
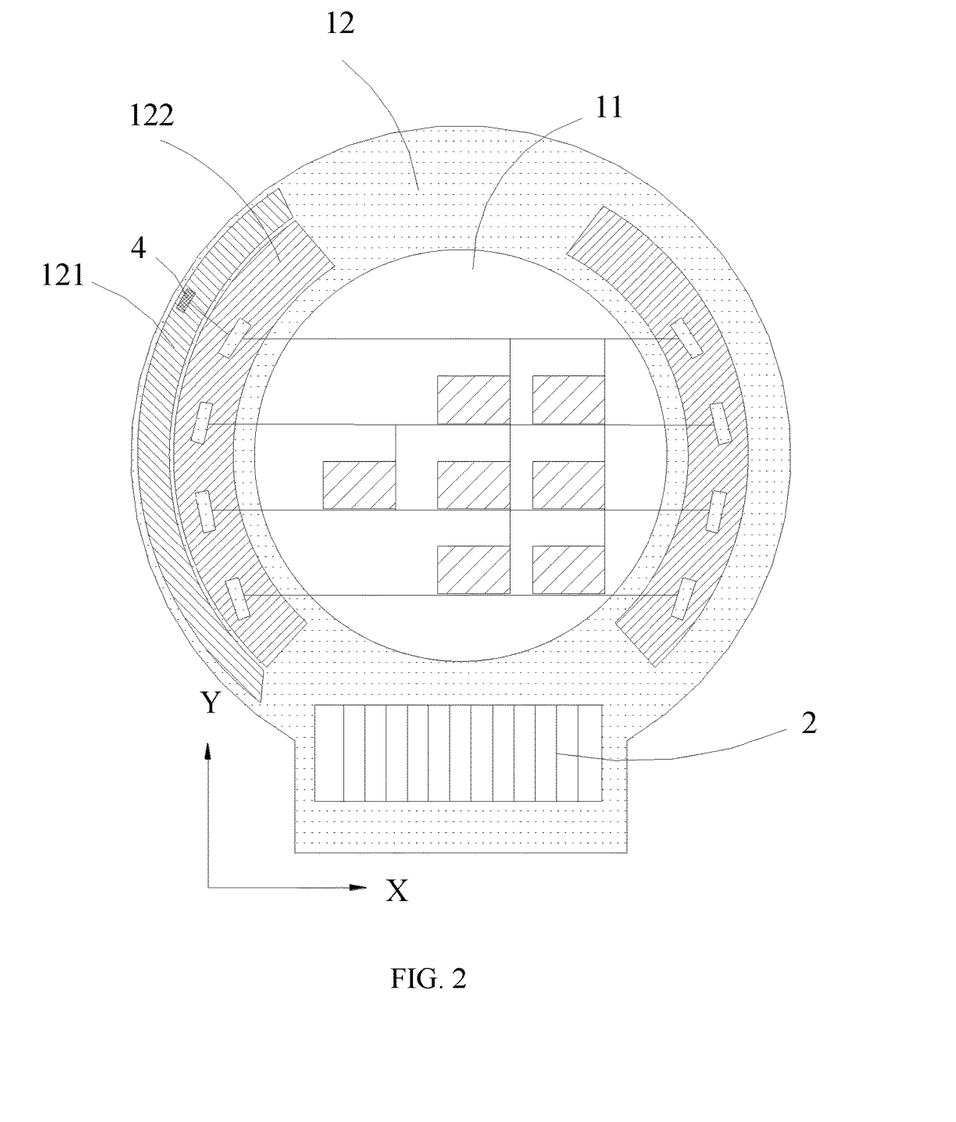
FIG. 2 illustrates a schematic diagram of a first embodiment of an area where a load compensating unit is located according to the present disclosure.

Please refer to FIG. 2, the non-display area 12 also includes a drive signal line area 121 and a gate driving circuit area 122, the drive signal line area 121 is the region where the connecting line connecting the integrated circuit 2 with the gate driving circuit 3 is located, the gate driving circuit area 122 is the region where the gate driving circuit 3 is located, the drive signal line area 121 is located at a side of the gate driving circuit area 122 away from the display area 11.

In FIG. 2, at least one load compensating unit 4 can be arranged in a portion of the drive signal line area 121 away from the gate driving circuit area 122.

Figure 3:
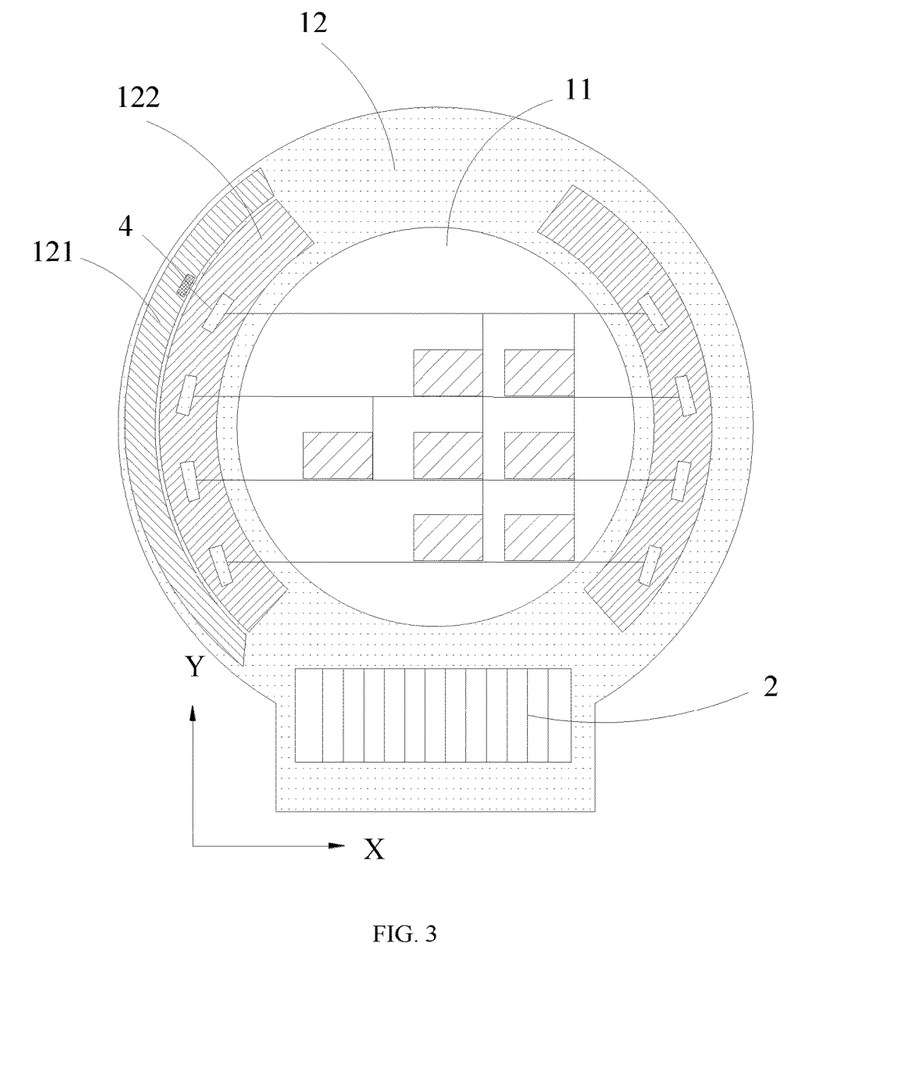
FIG. 3 illustrates a schematic diagram of a second embodiment of an area where a load compensating unit is located according to the present disclosure.

In FIG. 3, optionally, at least one load compensating unit 4 can be arranged in a portion of the drive signal line area 121 close to the gate driving circuit area 122.

Figure 4:
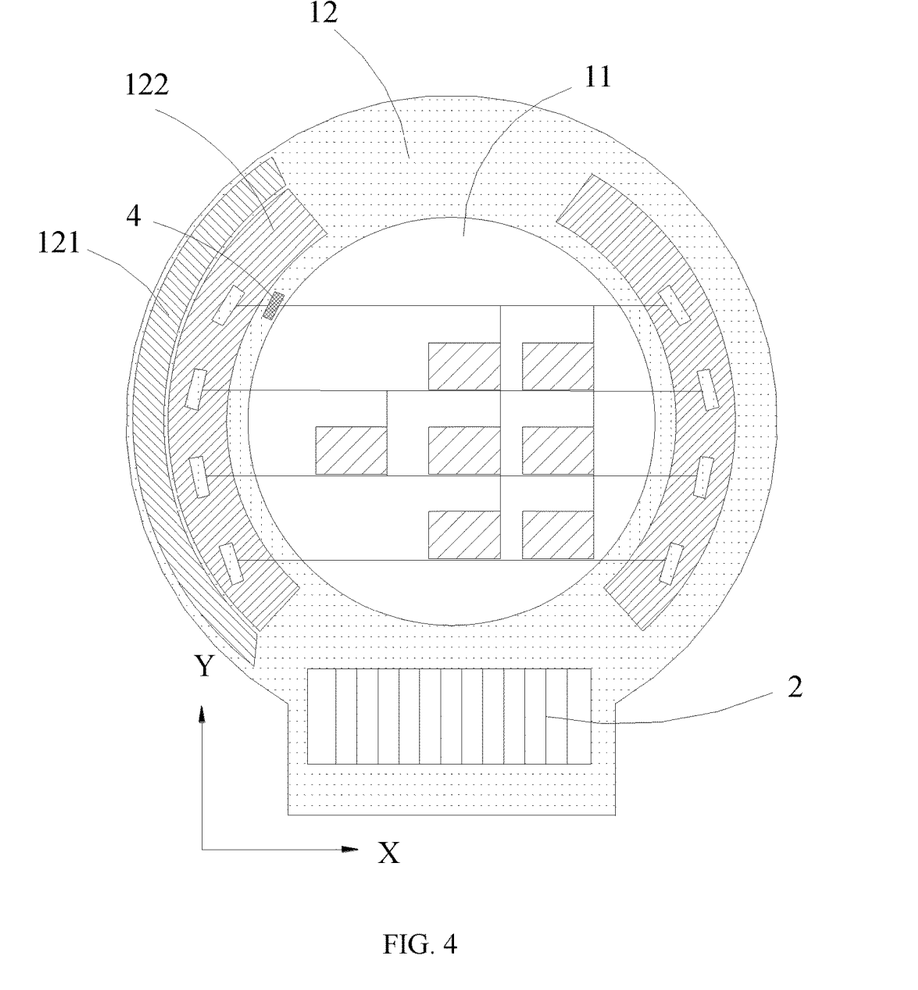
FIG. 4 illustrates a schematic diagram of a third embodiment of an area where a load compensating unit is located according to the present disclosure.

In FIG. 4, optionally, at least one load compensating unit 4 can also be arranged in a portion of the gate driving circuit area 122 away from the drive signal line area 121.

In three embodiments shown in FIGS. 2-4, the load compensating unit 4 can be arranged at different locations of the display panel 1, the above-mentioned arrangement makes the location of the load compensating unit 4 more flexible, so as to reduce the arrangement difficulty of the load compensating unit 4. Besides, although the location of the load compensating unit 4 is different, each load compensating unit 4 at different locations can make the loads of the gate driving circuit 3 tend to be identical, so as to improve the display quality of the display panel 1.

It should be noted that, the number of the load compensating unit 4 can be matched with the number of the scan line 111, that is, each load compensating unit 4 and each scan line 111 are in one-to-one correspondence, respectively, the numbers of them are identical. Alternatively, the number of the load compensating unit 4 can also be different from the number of the scan line 111, that is, they are not arranged in one-to-one correspondence.

Figure 5:
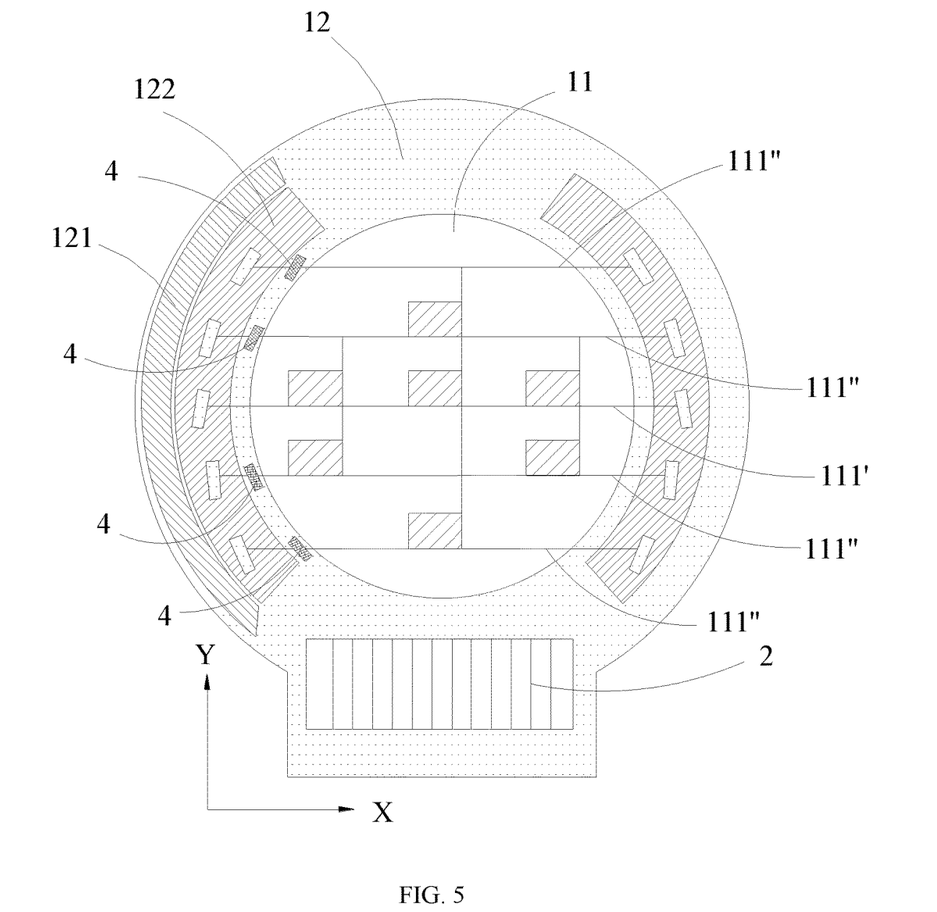
FIG. 5 illustrates a schematic diagram showing that load compensating units are not in one-to-one correspondence to scan lines according to an embodiment of the present disclosure.

Please refer to FIG. 5, which illustrates a situation that the load compensating unit 4 and the scan line 111 are not in one-to-one correspondence. In the circular display area 11, the scan lines 111 are arranged parallel to each other, and in the plurality of scan lines 111, one of the scan lines 111 is arranged at the middle position of the display area 11 and extends along the radial direction of the circular display area 11, this scan line 111 is denoted as a first scan line 111', the other scan lines 111 are all denoted as second scan lines 111", the second scan lines 111" are symmetrically arranged at two sides of the first scan line 111'. At this time, the load compensating unit 4 and the second scan line 111" can be arranged in one-to-one correspondence, and taking the load of the gate driving circuit 3 corresponding to the length of the first scan line 111' as a reference load, then compensating the load in each gate driving circuit 3 connected with the second scan line 111" in one-to-one correspondence. In this situation, it is not necessary to add load in the gate driving circuit 3 connected with the first scan line 111', and it is only necessary to compensate the load of each gate driving circuit 3 connected with the second scan line 111". After such arrangement, the number of the load compensating unit 4 can be reduced, and the processing procedure of the display panel 1 can be simplified.

The load compensating unit 4 for compensating the gate driving circuit 3 can include a virtual pixel unit, although the display performance of the virtual pixel unit is different from that of the real pixel unit, the virtual pixel unit can still be the load added in the gate driving circuit 3, and consumes the energy of the gate driving circuit 3, so as to balance the load of each gate driving circuit 3 connected with each scan line 111.

Figure 6:
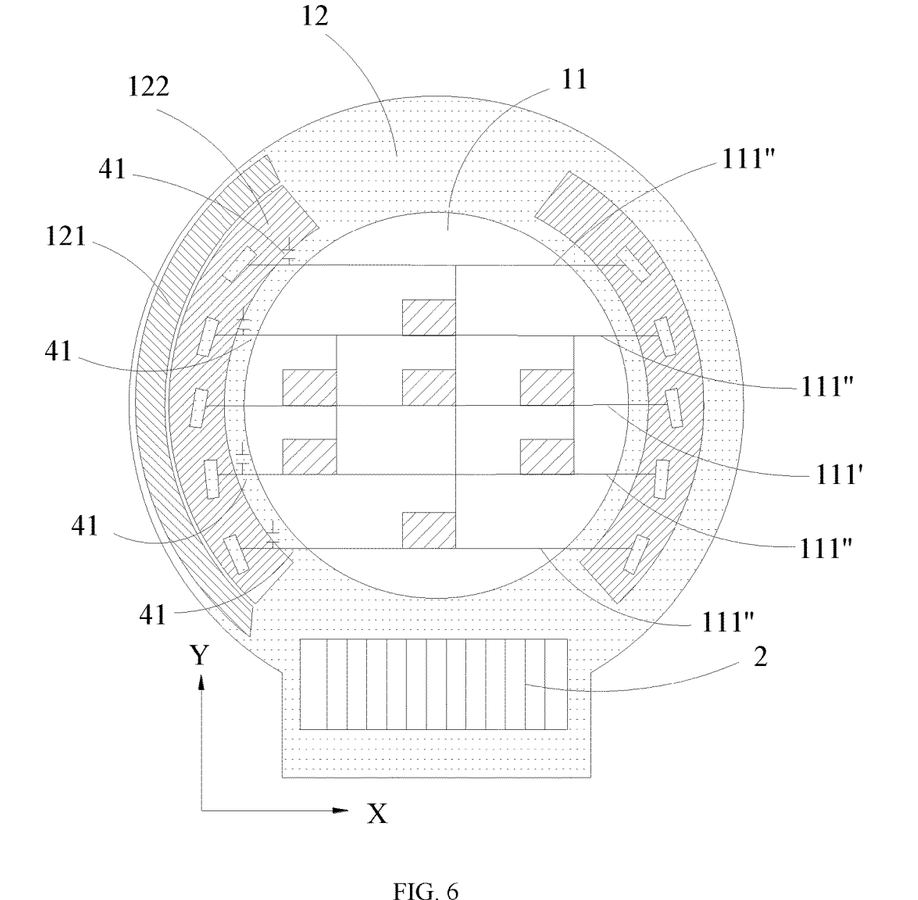
FIG. 6 illustrates a schematic diagram of a load compensating unit including a capacitor according to an embodiment of the present disclosure.

Please refer to FIG. 6, which illustrates a schematic diagram of a first embodiment of the load compensating unit 4. The load compensating unit 4 can also include a capacitor 41, the capacitor 41 can adopt a parallel-plate capacitor. In the embodiment shown in FIG. 6, the extending portion 113 connected with the scan line 111 and located in the non-display area 12 can be a metal plate of the parallel-plate capacitor 41, the other metal plate of the capacitor 41 can be a part of another component, as long as the parallel-plate capacitor formed by the two metal plates can form a load on the gate driving circuit 3.

Figure 7:
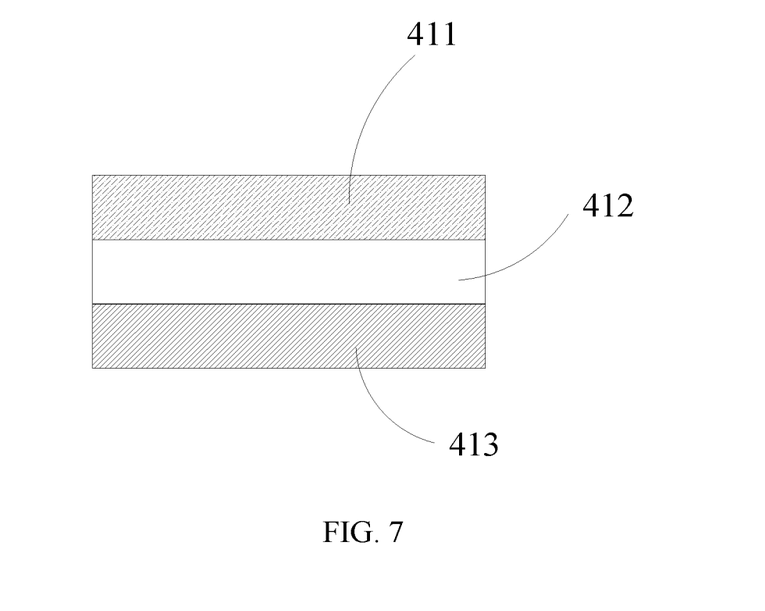
FIG. 7 illustrates a structural schematic diagram of a capacitor being a parallel-plate capacitor according to an embodiment of the present disclosure.

Please refer to FIG. 7, which illustrate a structural schematic diagram of the capacitor 41 being the parallel-plate capacitor. The capacitor 41 includes a first metal coupling layer 411, a dielectric layer 412 and a second metal coupling layer 413. The first metal coupling layer 411, the dielectric layer 412 and the second metal coupling layer 413 are successively arranged by stacking. It can be seen that, the first metal coupling layer 411 and the second metal coupling layer 413 form a parallel-plate capacitor, through adjusting the area of the first metal coupling layer 411 directly facing the second metal coupling layer 413 and the distance therebetween, the capacitance value of the capacitor 41 can be adjusted correspondingly, so as to adjust the load of each gate driving circuit 3.

Figure 8:
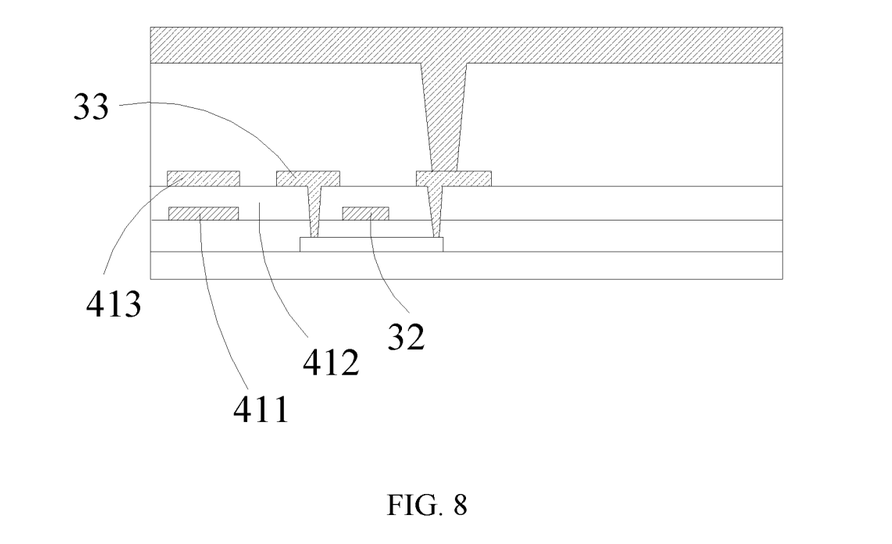
FIG. 8 illustrates a schematic diagram showing a first metal coupling layer and a gate electrode being arranged in a same layer according to an embodiment of the present disclosure.

Please refer to FIG. 8, which illustrates a schematic diagram showing that the first metal coupling layer 411 and the gate electrode 32 of the thin film transistor in the gate driving circuit 3 are arranged in a same layer. The first metal coupling layer 411 and the gate electrode 32 are arranged in a same layer, which can simplify the processing procedure of the display panel 1, specifically, when etching the gate electrode 32, the shape and size of the gate electrode 32 can be adjusted through adjusting the shape and size of the mask plate, so that the first metal coupling layer 411 can be processed together with the gate electrode 32 when processing a same film layer.

In view of the above, it is easily understood that, the second metal coupling layer 413 can also be arranged with the source electrode/drain electrode 33 in a same layer, and the processing procedure is substantially the same, which will not be repeated herein.

Figure 9:
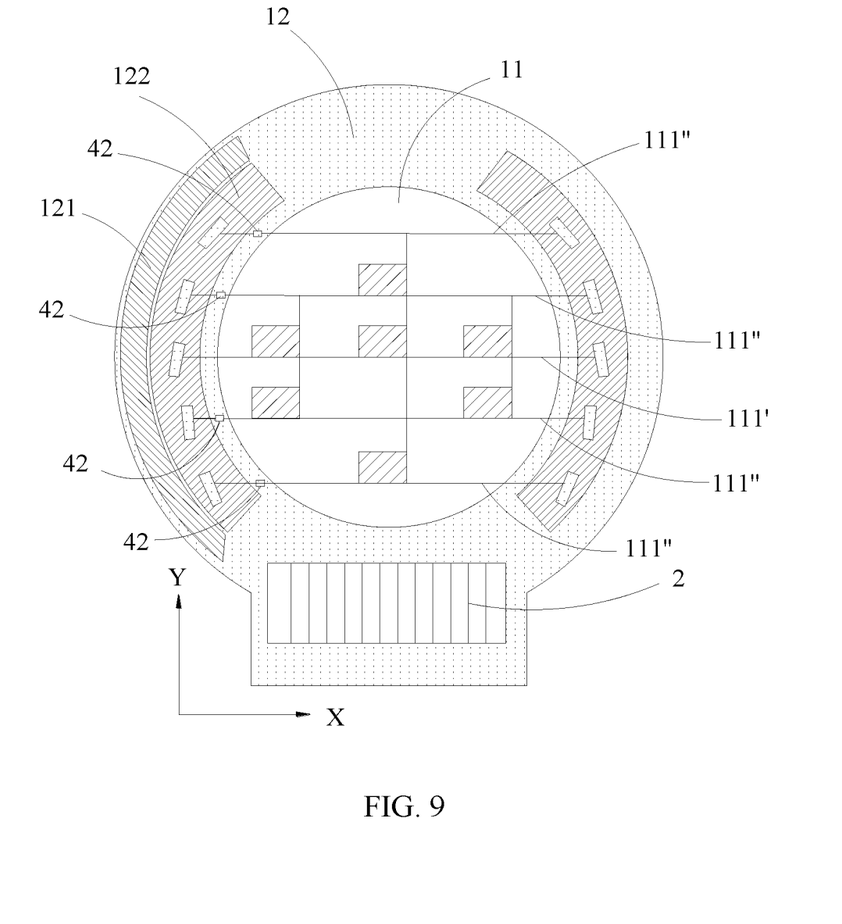
FIG. 9 illustrates a schematic diagram of a load compensating unit including a resistor according to an embodiment of the present disclosure.

Please refer to FIG. 9, which illustrates a schematic diagram of a second embodiment of the load compensating unit 4. The load compensating unit 4 can also include a resistor 42. The resistor 42 is a power consumption element, the magnitude of the resistor 42 can be selected according to the load on each gate driving circuit 3, so as to achieve a balanced load.

Figure 10:
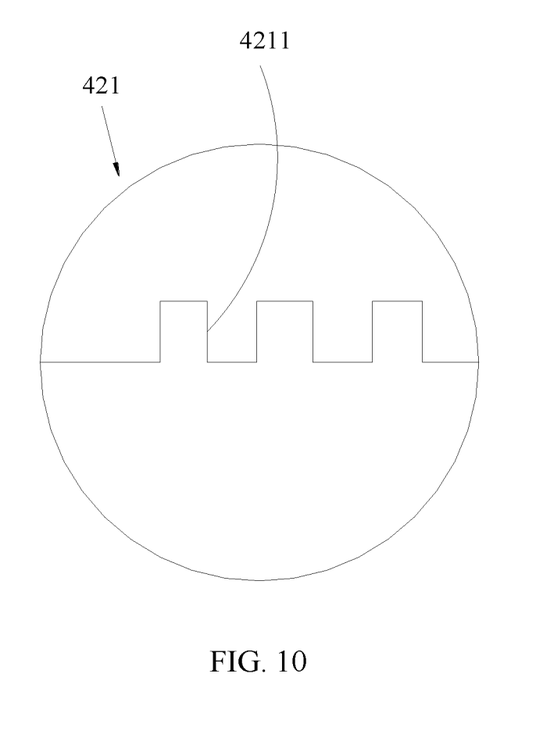
FIG. 10 illustrates a schematic diagram of a wire including multiple bending sections according to an embodiment of the present disclosure.

Please refer to FIG. 10, which illustrates a schematic diagram of an embodiment of the resistor 42. The resistor 42 can include a wire 421, the wire 421 includes at least one bending section 4211, when compensating the load in each gate driving circuit 3, it is possible that the number of bending sections 4211 of at least two wires 421 are not identical, thus different magnitudes of resistor can be loaded in the gate driving circuits 3.

It should be understood that, the connecting line located in the non-display area 12 and connecting the scan line 111 can be the wire 421, and the connecting line in the wiring group can also be the wire 421, the present disclosure will not limit thereon.

In addition to the solution of adjusting the magnitude of the resistor 42 through changing the length of the wire 421, it can also be arranged that the flow area of at least two wires 421 among the plurality of wires 421 are not identical, so as to adjust the load added in each gate driving circuit 3.

Figure 11:
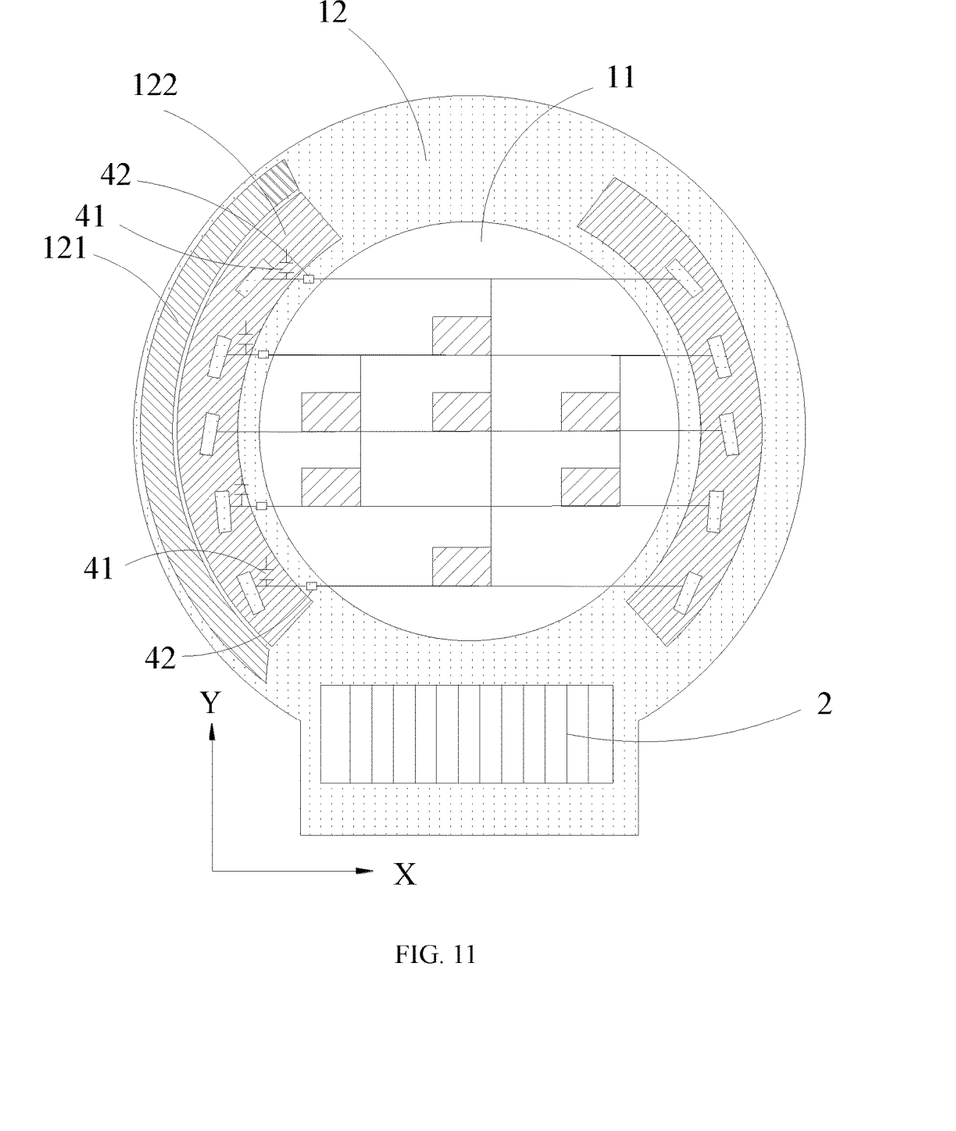
FIG. 11 illustrates a schematic diagram of a load compensating unit including a capacitor and a resistor according to an embodiment of the present disclosure.

Please refer to FIG. 11, which illustrate a schematic diagram of a third embodiment of the load compensating unit 4. The load compensating unit 4 can include a capacitor 41, and also include a resistor 42. The arrangement of the capacitor 41 and the resistor 42 can respectively refer to the above-mentioned solutions, and can also refer to other solutions different from the above-mentioned solutions, which will not be repeated herein.

In each embodiment of the above load compensating unit 4, the resistor 42 and the capacitor 41 can be regarded as power consumption electric elements which can consume a part of energy in the gate driving circuit 3. Appropriate resistance and capacitance can balance the load of each gate driving circuit 3 connected with each scan line 111, so that the drive delay signals in the scan lines 111 tend to be identical.

Figure 12:
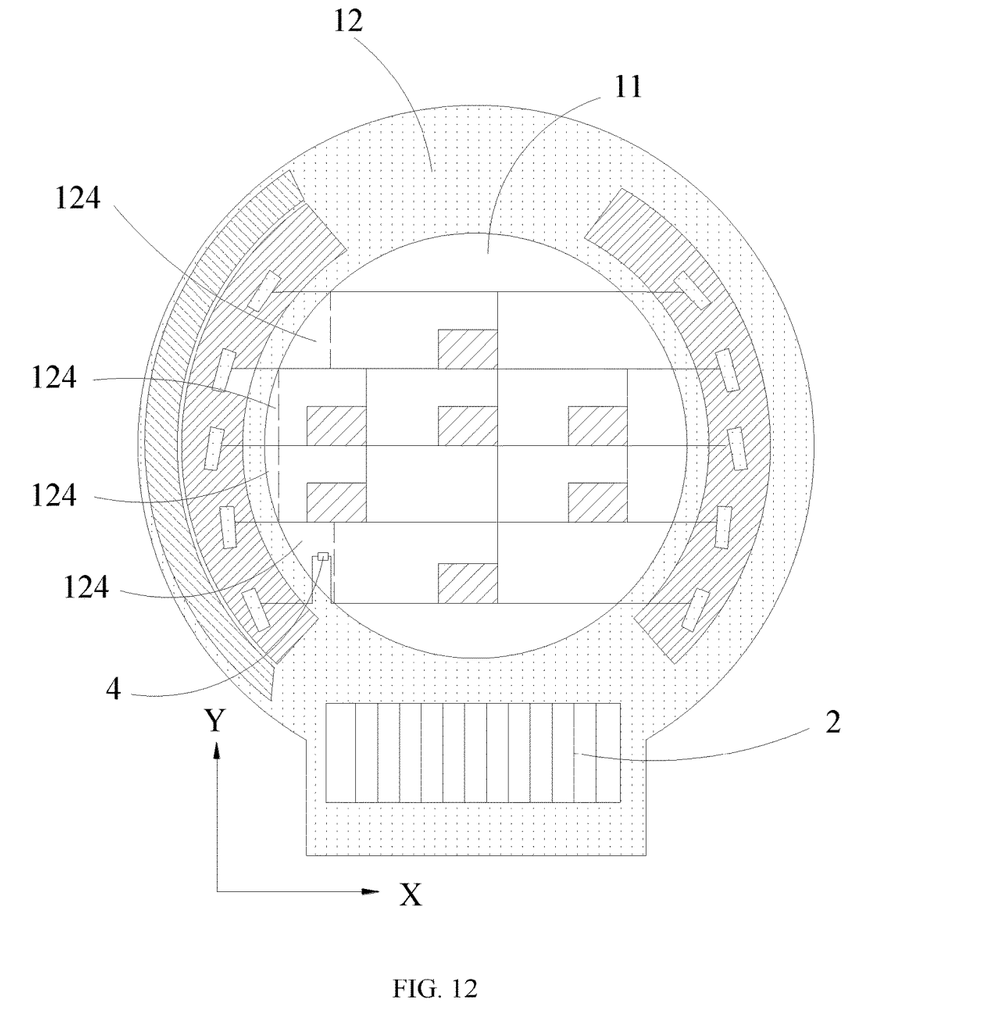
FIG. 12 illustrates a schematic diagram showing a zigzag region formed by two adjacent scan lines and an outer contour line of a display area in a circular display area according to an embodiment of the present disclosure.

Please refer to FIG. 12, the display area 11 is a circular region, at the edge of the display area 11, any two adjacent scan lines 111 and the outer contour line of the display area 11 form a zigzag region 124. At least one load compensating unit 4 can be arranged in the zigzag region 124. This solution saves the space occupied by the load compensating unit 4, and will not reduce the open rate of the display area 11.

Further, it is also possible that all the load compensating units 4 can be arranged in the zigzag regions 124, respectively, so that the distribution of the load compensating unit 4 is reasonable, and the structure of the display panel 1 is more compact.

In the present disclosure, the load compensating unit 4 and the scan line 111 can be arranged in different layers, after arranging according to this manner, the arrangement difficulty of the load compensating unit 4 and the scan line 111 are reduced significantly. Absolutely, the load compensating unit 4 and the scan line 111 can also be arranged in a same layer, for example, when the connecting line connected with the scan line 111 is arranged to be the resistor 42, the load compensating unit 4 and the scan line 111 are located in a same layer.

It should be explained that, the load compensating unit 4 is not only limited to the above-mentioned resistor 42, the capacitor 41 and the like, in some other embodiments, according to the structure of the display panel 1 and different practical environment, the load compensating unit 4 may also have some other implementing solutions.

When the load compensating unit 4 is connected with the gate driving circuit 3, the connecting manner therebetween can adopt a bridging manner, or a through-hole manner, the above-mentioned manners can be selected according to actual situations.

The shape of the display panel 1 and the display area 11 provided by the present disclosure are not limited by the circular shape provided by the embodiments of the present disclosure, in some other embodiments, shape of the display area 11 can also be oval or polygonal.

In addition, the display panel 1 provided by the present disclosure is adaptive to a liquid crystal display panel, and is also adaptive to an organic light-emitting diode (Organic Light-Emitting Diode, OLED) display panel, but is not limited by the above-mentioned two types of display panels.

Figure 13:
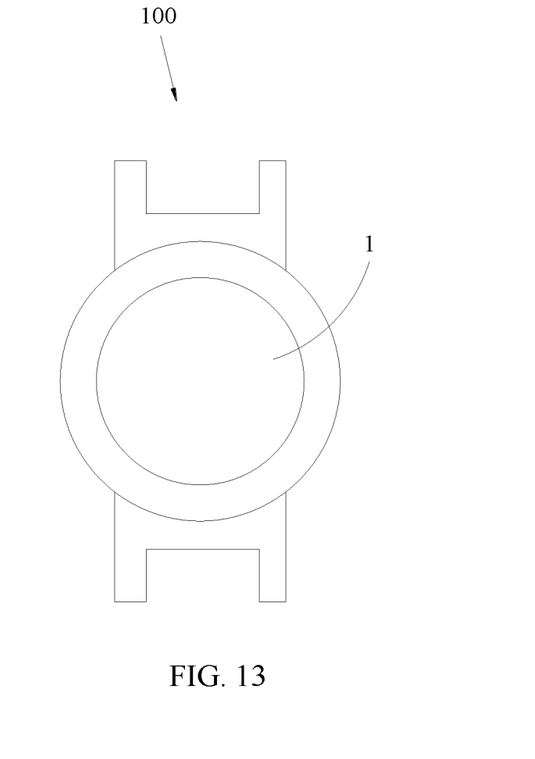
FIG. 13 illustrates a schematic diagram of a display device according to an embodiment of the present disclosure.

Please referring to FIG. 13, based on the above-mentioned display panel, the present disclosure also provides a display device 100, the display device 100 includes the above-mentioned display panel 1 in any embodiment. The display panel provided by the present disclosure includes, but not limit to, electronic devices such as watch, smart phone, tablet computer and the like.

The above are merely the preferred embodiments of the present disclosure, which will not limit the present disclosure. For those skilled in the art, the present disclosure can have various modifications and variations. Any modifications, equivalent replacements and improvements based on the present disclosure shall all fall in the protection scope of the present disclosure.

What is claimed is:

1. A display panel, comprising:
    a display area, the display area comprising a plurality of scan lines each connected with at least one pixel unit; and
    a non-display area, the non-display area comprising a plurality of gate driving circuits and at least one load compensating unit;
    wherein at least two of the plurality of scan lines have different lengths, and the at least two scan lines having different lengths are connected with different numbers of pixel units;
    each of the plurality of gate driving circuits is respectively connected with one of the plurality of scan lines;
    each of the at least one load compensating unit corresponds to one of the plurality of gate driving circuits to compensate a load of the one of the plurality of gate driving circuits, and the larger a length of the scan line connected with the gate driving circuit is, the greater the number of pixel units connected with the scan line is, and the smaller a load added by a corresponding load compensating unit is;
    wherein the at least one load compensating unit comprises a capacitor.

2. The display panel according to claim 1, wherein the non-display area further comprises a drive signal line area and a gate driving circuit area where the plurality of gate driving circuits is located, the drive signal line area is located at a side of the gate driving circuit area away from the display area,
    at least one load compensating unit is arranged in a portion of the drive signal line area away from the gate driving circuit area; or,
    at least one load compensating unit is arranged in a portion of the drive signal line area close to the gate driving circuit area; or,
    at least one load compensating unit is arranged in a portion of the gate driving circuit area away from the drive signal line area.

3. The display panel according to claim 1, wherein a shape of the display area is circular, oval or polygonal.

4. The display panel according to claim 1, wherein the display panel is a liquid crystal display panel or an organic light-emitting diode (OLED) display panel.

5. The display panel according to claim 1, wherein the capacitor comprises a first metal coupling layer, a dielectric layer and a second metal coupling layer; the first metal coupling layer, the dielectric layer and the second metal coupling layer are successively arranged by stacking.

6. The display panel according to claim 5, further comprising:
    a thin film transistor, the thin film transistor comprising a gate electrode,
    wherein the first metal coupling layer and the gate electrode are arranged in a same layer.

7. The display panel according to claim 1, wherein the scan lines are arranged parallel to each other, one of the plurality of scan lines is a first scan line, the other scan lines are second scan lines,
    the first scan line is arranged at a middle position of the display area, the second scan lines are symmetrically arranged at two sides of the first scan line;

a load corresponding to a length of the first scan line is taken as a reference load, the load compensating units and the second scan lines are arranged in one-to-one correspondence, so that loads in other gate driving circuits connected with the second scan lines in one-to-one correspondence are compensated accordingly.

8. The display panel according to the claim 7, wherein the display area is a circular region, any two adjacent second scan lines and an outer edge of the display area surround to form a zigzag region, and at least one load compensating unit is arranged in the zigzag region.

9. The display panel according to claim 1, wherein the load compensating unit and the scan line are arranged in different layers.

10. The display panel according to claim 9, wherein the load compensating unit is connected with the gate driving circuit through bridging or through a through hole.

11. The display panel according to claim 1, wherein the at least one load compensating unit comprises a virtual pixel unit.

12. The display panel according to claim 11, wherein the at least one load compensating unit comprises a resistor.

13. The display panel according to claim 12, wherein the resistor comprises a plurality of wires for respectively compensating loads in the plurality of gate driving circuits, each wire comprises at least one bending section, the number of the bending sections of at least two of the plurality of wires are not identical.

14. The display panel according to claim 12, wherein the resistor comprises a plurality of wires for respectively compensating loads in the plurality of gate driving circuits, cross sections of at least two wires are not identical.

15. A display device, comprising a display panel, wherein the display panel comprises:
a display area, the display area comprising a plurality of scan lines each connected with at least one pixel unit; and
a non-display area, the non-display area comprising a plurality of gate driving circuits and at least one load compensating unit;
wherein at least two of the plurality of scan lines have different lengths, and the at least two scan lines having different lengths are connected with different numbers of pixel units;
each of the plurality of gate driving circuit is respectively connected with one of the plurality of scan lines;
each of the at least one load compensating unit corresponds to one of the plurality of gate driving circuits to compensate a load of the one of the plurality of gate driving circuits, and the larger a length of the scan line connected with the gate driving circuit, the greater the number of pixel units connected with the scan line, and the smaller a load added by a corresponding load compensating unit;
wherein the at least one load compensating unit comprises a capacitor.

* * * * *